United States Patent
Miura (10) Patent No.: US 9,401,494 B2
(45) Date of Patent: Jul. 26, 2016

(54) DISPLAY PANEL, DISPLAY UNIT, AND ELECTRONIC APPARATUS

(71) Applicant: Sony Corporation, Tokyo (JP)

(72) Inventor: Kiwamu Miura, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/346,889

(22) PCT Filed: Oct. 10, 2012

(86) PCT No.: PCT/JP2012/076179
§ 371 (c)(1),
(2) Date: Mar. 24, 2014

(87) PCT Pub. No.: WO2013/058146
PCT Pub. Date: Apr. 25, 2013

(65) Prior Publication Data
US 2014/0231789 A1   Aug. 21, 2014

(30) Foreign Application Priority Data
Oct. 19, 2011   (JP) .................................. 2011-229995

(51) Int. Cl.
*H01L 51/52*   (2006.01)
*H01L 51/50*   (2006.01)
*H01L 27/32*   (2006.01)

(52) U.S. Cl.
CPC ......... *H01L 51/5209* (2013.01); *H01L 27/3244* (2013.01); *H01L 51/5056* (2013.01); *H01L 51/5088* (2013.01); *H01L 2251/53* (2013.01)

(58) Field of Classification Search
CPC ............ H01L 51/5206; H01L 51/5209; H01L 51/5088
USPC .............................. 257/40, E51.018, E51.019
See application file for complete search history.

(56) References Cited

U.S. PATENT DOCUMENTS

| | | | |
|---|---|---|---|
| 2002/0036291 A1* | 3/2002 | Parker et al. | 257/72 |
| 2008/0111474 A1* | 5/2008 | Sung | H01L 27/322 313/504 |
| 2010/0309101 A1* | 12/2010 | Kanegae et al. | 345/76 |
| 2011/0180821 A1* | 7/2011 | Matsushima | 257/88 |
| 2011/0315966 A1 | 12/2011 | Okamoto | |
| 2012/0248467 A1* | 10/2012 | Yokoyama et al. | 257/88 |

FOREIGN PATENT DOCUMENTS

| | | |
|---|---|---|
| JP | 2008-033193 A | 2/2008 |
| JP | 2008-235066 A | 10/2008 |
| JP | 2011-155004 A | 8/2011 |
| WO | WO-2010/134237 A1 | 11/2010 |

* cited by examiner

*Primary Examiner* — Shaun Campbell
*Assistant Examiner* — Aneta Cieslewicz
(74) *Attorney, Agent, or Firm* — Chip Law Group (57) ABSTRACT

There are provided a display panel, a display unit, and an electronic apparatus that make it possible to reduce a leakage current arising between adjacent pixels. The display panel includes a plurality of pixels at a display region. Each of the pixels has an organic EL device, and a pixel circuit that drives the organic EL device. The organic EL device has an anode electrode, a cathode electrode, and an organic layer that is provided between the anode electrode and the cathode electrode. A side surface of the anode electrode is structured in such a manner that the cross-sectional area of the anode electrode on the side of the cathode electrode is larger than that of the anode electrode on the opposite side of the cathode electrode.

10 Claims, 9 Drawing Sheets

DISPLAY PANEL, DISPLAY UNIT, AND ELECTRONIC APPARATUS

TECHNICAL FIELD

The present technology relates to a display panel that includes an organic EL (Electroluminescence) device on each pixel basis, and a display unit that includes such a display panel. Further, the present technology relates to an electronic apparatus that includes the above-described display unit.

BACKGROUND ART

In recent years, in the field of a display unit that performs an image display, a display unit has been developed that uses, as a light-emitting device in a pixel, a current-driven type optical device in which the emission luminance varies depending on a value of a flowing current, such as an organic EL device, and the product commercialization of such a display unit has been carried forward. Unlike a liquid crystal device and the like, the organic EL device is a self-emitting device. Therefore, a display unit using the organic EL device (an organic EL display unit) eliminates the necessity for the use of a light source (backlight), and thus it is possible to achieve the lower-profile appearance and the higher luminance as compared with a liquid crystal display unit involving a light source. Especially, when an active-matrix method is used as a drive method, it is possible to make each pixel luminous in a hold state, as well as to reduce the power consumption. Accordingly, it is expected that the organic EL display unit will go mainstream of a next-generation flat-panel display.

In an active-matrix display unit, a current flowing through an organic EL device that is arranged on each pixel basis is controlled by a thin-film transistor (TFT) that is provided within a pixel circuit provided for each of the organic EL devices (for example, see PTL 1).

CITATION LIST

Patent Literature

[PTL 1] Japanese Unexamined Patent Application Publication No. 2008-33193

SUMMARY OF THE INVENTION

An organic EL device is an electronic device in which a thin film made of an organic compound is provided between an anode electrode and a cathode electrode. In the organic EL device, holes and electrons are injected from each of the anode electrode and the cathode electrode, and an energy that is generated by recombination of those holes and electrons is extracted as light. Therefore, it is possible to achieve the advantageous effects such as a reduction in a drive voltage and the improvement of the luminescent efficiency by improving the injection characteristics of the holes.

In a case where the organic EL device is a low-molecular vapor-deposited type, when the organic EL devices are arranged in an array, a light-emitting layer is formed by performing the vapor deposition selectively on each pixel basis using an evaporation mask. However, any other layers excluding the light-emitting layer on an organic layer may be preferably formed in common in each pixel in terms of the improvement in productivity and the reduction in manufacturing costs. Nevertheless, if a hole injection layer (HIL) is formed in common in each pixel, a leakage current occurs between the adjacent pixels due to low resistivity of the hole injection layer, resulting in any pixels other than desired pixels being luminescent as well. As a result, there was a disadvantage of occurrence of color mixture and deterioration in the image quality.

Accordingly, it is desirable to provide a display panel, a display unit, and an electronic apparatus that make it possible to reduce a leakage current arising between adjacent pixels.

A display panel according to an embodiment of the present technology includes a plurality of pixels at a display region. Each of the pixels has an organic EL device, and a pixel circuit that drives the organic EL device. The organic EL device has an anode electrode, a cathode electrode, and an organic layer that is provided between the anode electrode and the cathode electrode. A side surface of the anode electrode is structured in such a manner that the cross-sectional area of the anode electrode on the side of the cathode electrode is larger than that of the anode electrode on the opposite side of the cathode electrode.

A display unit according to an embodiment of the present technology includes the above-described display panel, and a driving circuit that drives each of the pixels. An electronic apparatus according to an embodiment of the present technology includes the above-described display unit.

In the display panel, the display unit, and the electronic apparatus according to an embodiment of the present technology, a side surface of the anode electrode on the organic EL device is structured in such a manner that the cross-sectional area of the anode electrode on the side of the cathode electrode is larger than that of the anode electrode on the opposite side of the cathode electrode. With such a structure, for example, when a hole injection layer is laminated over a whole region corresponding to a region including all the pixels inside a display region, it is possible to form a high-resistivity structure at a position corresponding to the side surface of each anode electrode on the hole injection layer.

According to the display panel, the display unit, and the electronic apparatus of an embodiment of the present technology, it is possible to form a high-resistivity structure at a position corresponding to the side surface of each anode electrode on the hole injection layer in the manufacturing process of the hole injection layer, thus allowing to suppress occurrence of a leakage current between the adjacent pixels. As a result, this makes it possible to suppress occurrence of color mixture and deterioration in the image quality.

MODES FOR CARRYING OUT THE INVENTION

An embodiment of the present technology will be described below with reference to the drawings. It is note that the description will be provided in the following order.
1. Embodiment (Display Unit)
An example where a hole injection layer is stepped-cut on the side surface of an anode electrode.
2. Application Examples (Electronic Apparatuses)
An example where the display unit according to the above-described embodiment of the present technology is applied to the electronic apparatuses.

1. Embodiment

Configuration

Figure 1:
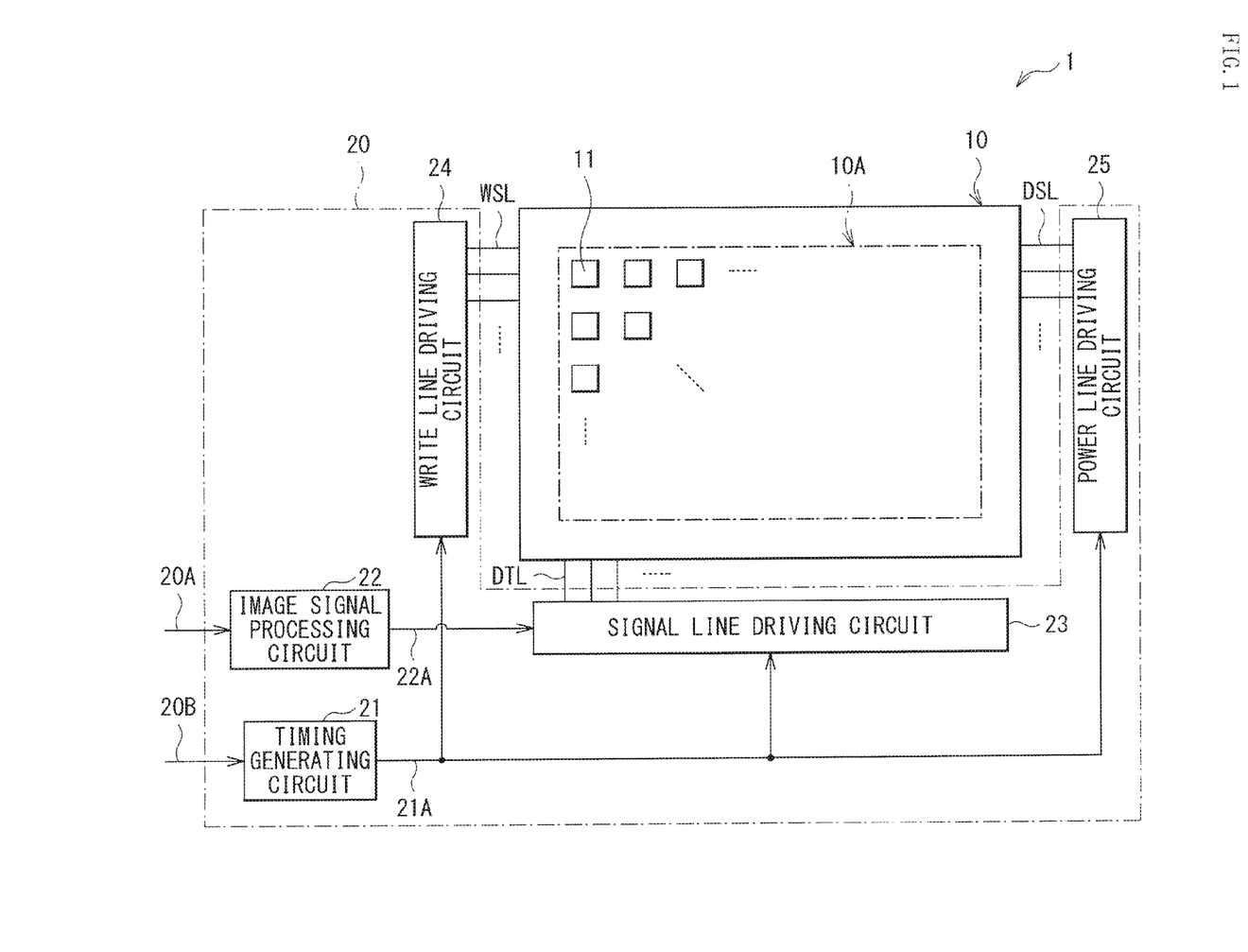
FIG. 1 is a diagram showing an example of a configuration of a display unit according to an embodiment of the present technology.

FIG. 1 shows a simplified configuration of a display unit 1 according to an embodiment of the present technology. This display unit 1 includes a display panel 10, and a driving circuit 20 that drives the display panel 10. The driving circuit 20 may have, for example, a timing generating circuit 21, an image signal processing circuit 22, a signal line driving circuit 23, a write line driving circuit 24, and a power line driving circuit 25.
(Display Panel 10)
The display panel 10 is configured in such a manner that a plurality of pixels 11 are arranged two-dimensionally over a whole area of a display region 10A on the display panel 10. The pixel 11 corresponds to a point being the minimum unit that configures a display screen on the display panel 10. The pixel 11 corresponds to a sub-pixel that emits light of a plain color, such as red, green, or blue when the display panel 10 is a color display panel, and corresponds to a sub-pixel that emits white light when the display panel 10 is a monochrome display panel.

Figure 2:
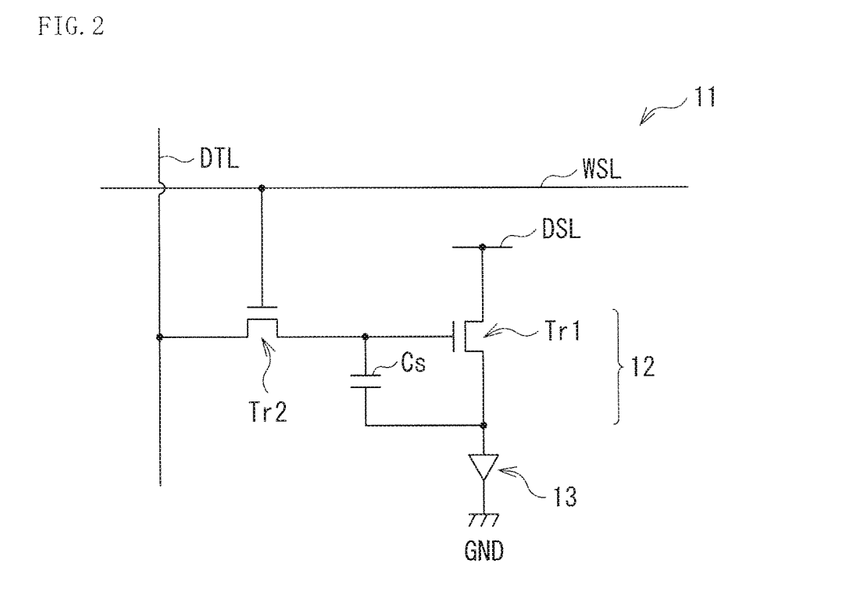
FIG. 2 is a diagram showing an example of a configuration of a pixel.

The display panel 10 displays an image based on an image signal 20A that is input externally in such a manner that each of the pixels 11 is driven in the active matrix method by the driving circuit 20. FIG. 2 shows an example of a circuit configuration for the pixel 11. For example, as shown in FIG. 2, the pixel 11 may have a pixel circuit 12 and an organic EL device 13.

For example, as shown in FIG. 2, the pixel circuit 12 may be configured of a driving transistor Tr1, a writing transistor Tr2, and a storage capacitor Cs, which is equivalent to a circuit configuration of 2Tr1C. The writing transistor Tr2 samples a voltage on a signal line DTL to be hereinafter described, and at the same time writes such a voltage to a gate of the driving transistor Tr1. The driving transistor Tr1 controls a current flowing through the organic EL device 13 depending on a magnitude of the voltage written by the writing transistor Tr2. The storage capacitor Cs stores a predetermined voltage between a gate and a source of the driving transistor Tr1. It is to be noted that the pixel circuit 12 may adopt a circuit configuration different from the above-described circuit configuration of 2Tr1C.

Each of the driving transistor Tr1 and the writing transistor Tr2 may be formed of, for example, an n-channel MOS thin-film transistor (TFT). It is to be noted that a type of such a TFT is not limited specifically, but for example, an inversely-staggered structure (bottom-gate type) or a staggered structure (top-gate type) may be permitted alternatively. Further, the driving transistor Tr1 or the writing transistor Tr2 may be also a p-channel MOS TFT.

As shown in FIG. 2, the display panel 10 has a plurality of write lines WSL extending in a row direction, a plurality of signal lines DTL extending in a column direction, and a plurality of power lines DSL extending in a row direction. The pixel 11 is provided in the vicinity of a point of intersection between each of the signal lines DTL and each of the write lines WSL. Each of the signal lines DTL is connected with an output end (not shown in the drawing) of the signal line driving circuit 23 to be hereinafter described and with a source or a drain of the writing transistor Tr2. Each of the write lines WSL is connected with an output end (not shown in the drawing) of the write line driving circuit 24 to be hereinafter described and with a gate of the writing transistor Tr2. Each of the power lines DSL is connected with an output end (not shown in the drawing) of a power supply that outputs a fixed voltage and with a source or a drain of the driving transistor Tr1.

Figure 3:
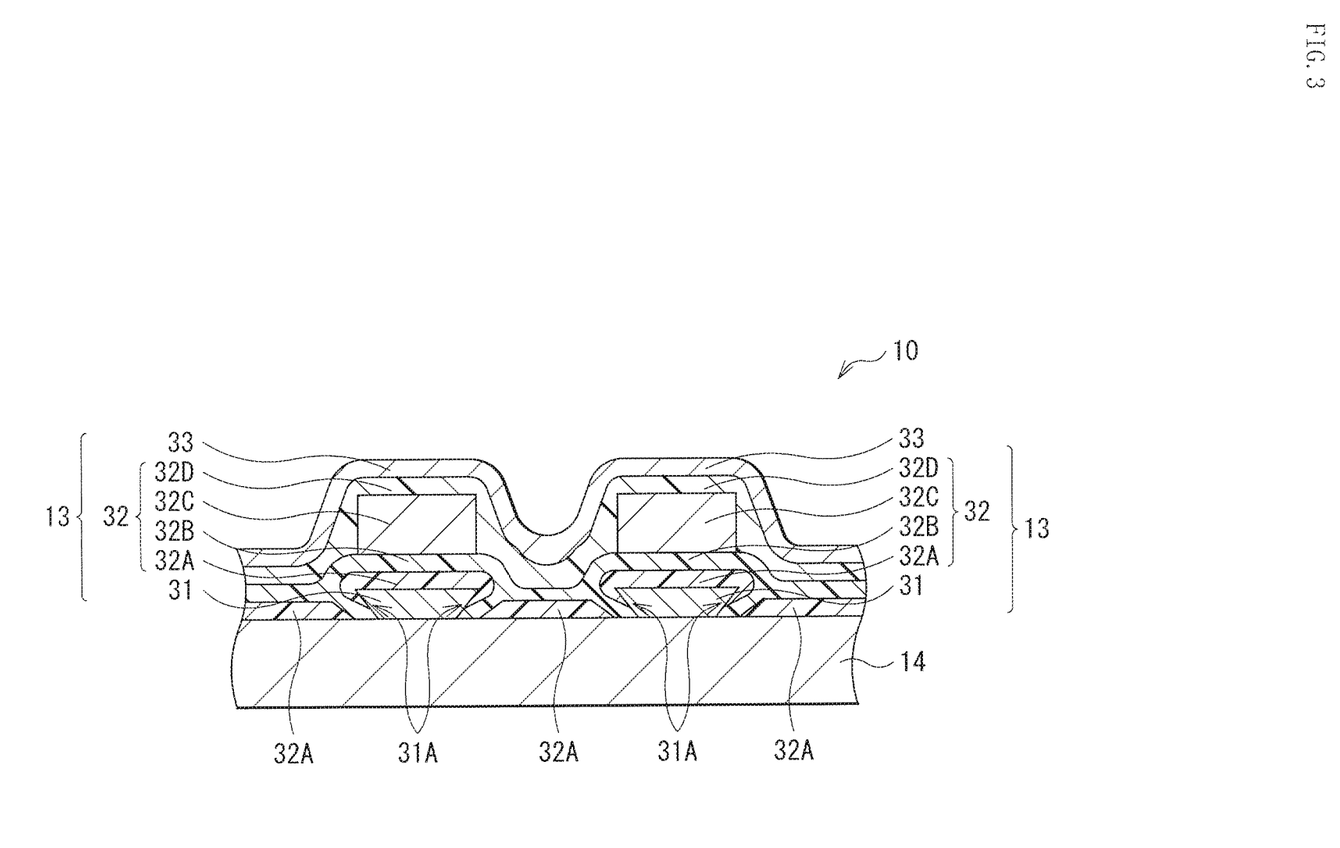
FIG. 3 is a diagram showing an example of a cross-sectional configuration of an organic EL device.
Figure 4:
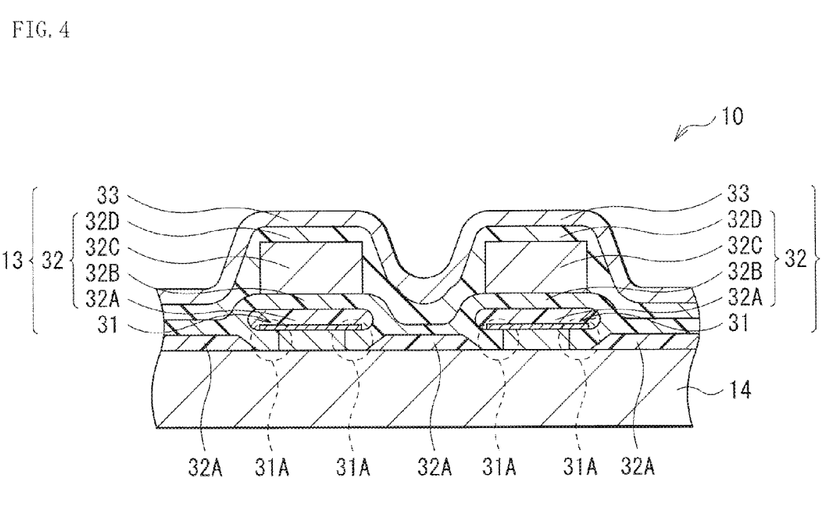
FIG. 4 is a diagram showing another example of a cross-sectional configuration of the organic EL device.

The gate of the writing transistor Tr2 is connected with the write line WSL. The source or the drain of the writing transistor Tr2 is connected with the signal line DTL, and a terminal of the source or the drain of the writing transistor Tr2 that is unconnected with the signal line DTL is connected with a gate of the driving transistor Tr1. The source or the drain of the driving transistor Tr1 is connected with the power line DSL, and a terminal of the source or the drain of the driving transistor Tr1 that is unconnected with the power line DSL is connected with an anode of the organic EL device 13. A first end of the storage capacitor Cs is connected with the gate of the driving transistor Tr1, and a second end of the storage capacitor Cs is connected with the source of the driving transistor Tr1 (a terminal on the side of the organic EL device 13 in FIG. 2). In other words, the storage capacitor Cs is inserted between the gate and the source of the driving transistor Tr1. A cathode of the organic EL device 13 is connected with a ground line GND. The ground line GND is electrically connected with an external circuit (not shown in the drawing) that is specified at a reference potential (for example, a ground potential).
(Structure Inside Display Panel 10)
Next, with reference to FIG. 3 and FIG. 4, the description is provided on a structure inside the display panel 10. FIG. 3 shows an example of a cross-sectional configuration of the organic EL device 13 and the vicinity thereof inside the display panel 10. FIG. 4 shows another example of a cross-sectional configuration of the organic EL device 13 and the vicinity thereof inside the display panel 10. For example, as shown in FIG. 3 and FIG. 4, the display panel 10 may have the plurality of organic EL devices 13 that are provided corresponding to each of the pixels 11 on a TFT substrate 14. It is to be noted that the TFT substrate 14 is a substrate on which the pixel circuit 12 and the like are formed, and has a metallic layer (not shown in the drawings) that is electrically connected with the pixel circuit 12 at least on the uppermost surface. The organic EL device 13 is formed in contact with this metallic layer.

For example, as shown in FIG. 3 and FIG. 4, the organic EL device 13 may have an anode electrode 31 that is provided on the side of the TFT substrate 14, an organic layer 32 that is provided on the anode electrode 31, and a cathode electrode 33 that is provided on the organic layer 32. The anode electrode 31 is intended to inject holes into the organic layer 32. The anode electrode 31 may be configured of, for example, a material with the excellent hole injection property, such as an Al-based metal. Conceptually, the Al-based metal includes Al and Al alloy. The organic layer 32 emits light with brightness in accordance with the amount of a current flowing within the organic layer 32. The organic layer 32 has a laminated structure that may be configured by stacking, for example, a hole injection layer 32A that improves the hole injection efficiency, a hole transportation layer 32B that improves the efficiency of hole transportation to a light-emitting layer 32C to be hereinafter described, the light-emitting layer 32C that emits light by recombination of electrons and holes, and an electron transportation layer 32D that improves the efficiency of electron transportation to the light-emitting layer 32C in this order from the anode electrode 31 side. The cathode electrode 33 is intended to inject electrons into the organic layer 32. The cathode electrode 33 is configured of a material with the excellent electron injection property, and may be configured of, for example, a semi-transmissive metal material such as MgAg. The organic EL device 13 is a low-molecular vapor-deposited device, and the organic layer 32 is formed in a vapor deposition method.

Meanwhile, the side surface of the anode electrode 31 is structured in such a manner that the cross-sectional area of the anode electrode 31 on the side of the cathode electrode 33 is larger than that of the anode electrode 31 on the opposite side of the cathode electrode 33. As shown in FIG. 3, the side surface of the anode electrode 31 takes an inverse tapered shape. It is to be noted that, for example, as shown in FIG. 4, the side surface of the anode electrode 31 may take an eaves-like shape.

All the layers other than the light-emitting layer 32C on the organic layer 32 are formed over a whole region including all the pixels 11 inside the display region 10A. On the other hand, the light-emitting layer 32C is formed selectively for each of the organic EL devices 13, and may be formed, for example, selectively for each of regions facing the anode electrodes 31. Here, the hole transportation layer 32B and the electron transportation layer 32D are formed in common to all of the pixels 11. However, in each of the hole transportation layer 32B and the electron transportation layer 32D, the resistivity is larger than that of the hole injection layer 32A in addition to a smaller thickness, and thus the resistance in a laminated in-plane direction becomes large. Therefore, although the hole transportation layer 32B and the electron transportation layer 32D are formed in common to all of the pixels 11, they are substantially separated electrically from each other for each of the pixels 11.

On the other hand, the hole injection layer 32A has a high-resistivity structure at a position corresponding to the side surface of each of the anode electrodes 31. In the hole injection layer 32A illustrated in FIG. 3, the high-resistivity structure is a stepped-cut structure. This stepped-cut structure is formed in the inverse tapered shape that is formed on the side surface of the anode electrode 31 in forming the hole injection layer 32A on the anode electrode 31 in the vapor-deposition method. Also in the hole injection layer 32A illustrated in FIG. 4, the high-resistivity structure is a stepped-cut structure as well. This stepped-cut structure is formed in the eaves-like shape that is formed on the side surface of the anode electrode 31 in forming the hole injection layer 32A on the anode electrode 31 in the vapor-deposition method.

It is to be noted that, although the illustration is not given in the drawing, it may be difficult to form the stepped-cut structure at a position corresponding to the side surface of each of the anode electrodes 31 depending on a height or a depth of the above-described inverse tapered shape or eaves-like shape, and a local thin-film structure may be formed in some cases. In the local thin-film structure, a thickness of the hole injection layer 32A is smaller than a thickness of a location that does not correspond to the side surface of the anode electrode 31 on the hole injection layer 32A. Consequently, in the local thin-film structure, the resistivity of the hole injection layer 32A is higher than the resistivity of a location that does not correspond to the side surface of the anode electrode 31 on the hole injection layer 32A. In this case, therefore, the high-resistivity structure is the local thin-film structure.

Figure 5:
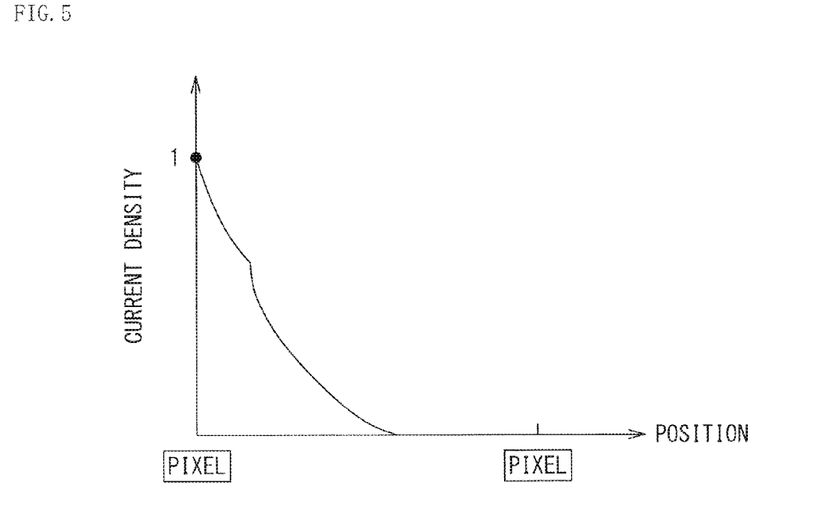
FIG. 5 is a diagram for explain a leakage current between pixels in a display panel illustrated in FIG. 1.
Figure 6:
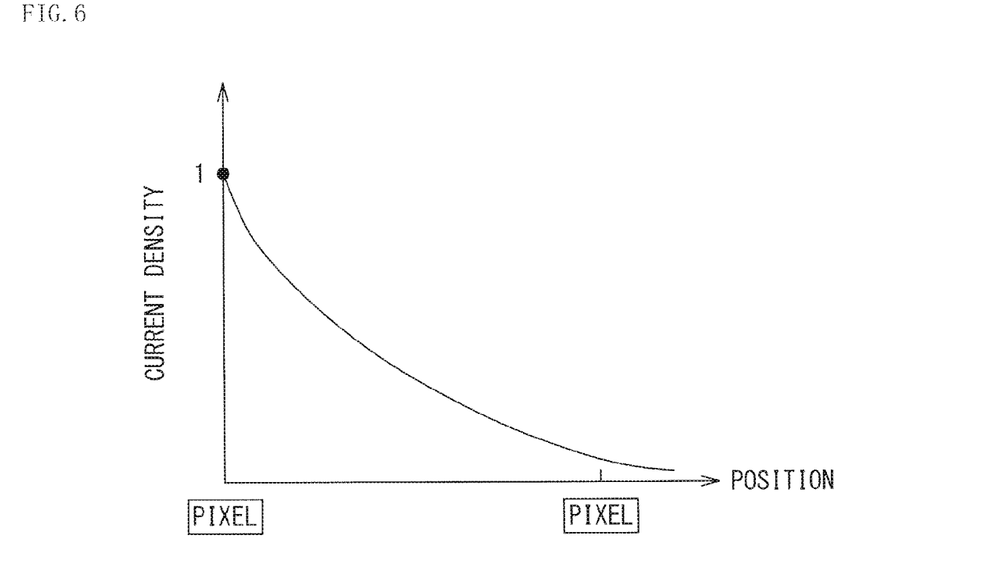
FIG. 6 is a diagram for explain a leakage current between pixels in a display panel according to a comparative example.

Each of FIG. 5 and FIG. 6 shows a leakage current flowing between the pixels as a distribution of the current density, and more specifically shows a distribution of the current density in the surrounding area of the pixel on the left side in the drawings at the time of luminescence of such a pixel. FIG. 5 shows an example of the current density distribution in a case where the high-resistivity structure is provided on the hole injection layer 32A. FIG. 6 shows an example of the current density distribution in a case where the high-resistivity structure is not provided on the hole injection layer 32A. In each of FIG. 5 and FIG. 6, the current density on a vertical axis is specified as the density of a current flowing through the pixel on the left side in the drawings at the time of luminescence of such a pixel.

In FIG. 5, the current density varies discontinuously, and decreases rapidly at a position of the high-resistivity structure on the hole injection layer 32A. Therefore, a leakage current from a luminescent pixel does not reach a pixel (pixel on the right side in FIG. 5) that is placed adjacent to the luminescent pixel. On the other hand, in FIG. 6, the current density decreases gently with distance from the luminescent pixel. Accordingly, a leakage current from the luminescent pixel reaches a pixel (pixel on the right side in FIG. 5) that is placed adjacent to the luminescent pixel. It is seen from the above that the high-resistivity structure on the hole injection layer 32A effectively blocks a leakage current from the luminescent pixel.

(Driving Circuit 20)

Next, a brief description is provided on the driving circuit 20. As described above, the driving circuit 20 may have, for example, the timing generating circuit 21, the image signal processing circuit 22, the signal line driving circuit 23, the write line driving circuit 24, and the power line driving circuit 25 as shown in FIG. 1. The timing generating circuit 21 controls each circuit within the driving circuit 20 to operate in conjunction with one another. For example, the timing generating circuit 21 may output a control signal 21A to each of the above-described circuits in accordance with (in synchronization with) a synchronous signal 20B that is input externally.

The image signal processing circuit 22 corrects a digital image signal 20A that is input externally, and at the same time converts the corrected image signal into an analog signal to output such a converted analog signal to the signal line driving circuit 23. The signal line driving circuit 23 outputs the analog image signal that is input from the image signal processing circuit 22 to each of the signal lines DTL in accordance with (in synchronization with) an input of the control signal 21A. The write line driving circuit 24 selects the plurality of write lines WSL sequentially on each predetermined unit basis in accordance with (in synchronization with) an input of the control signal 21A. The power line driving circuit 25 selects the plurality of power lines DSL sequentially on each predetermined unit basis in accordance with (in synchronization with) an input of the control signal 21A, for example.

[Method of Manufacturing Organic EL Device 13]

Figure 7:
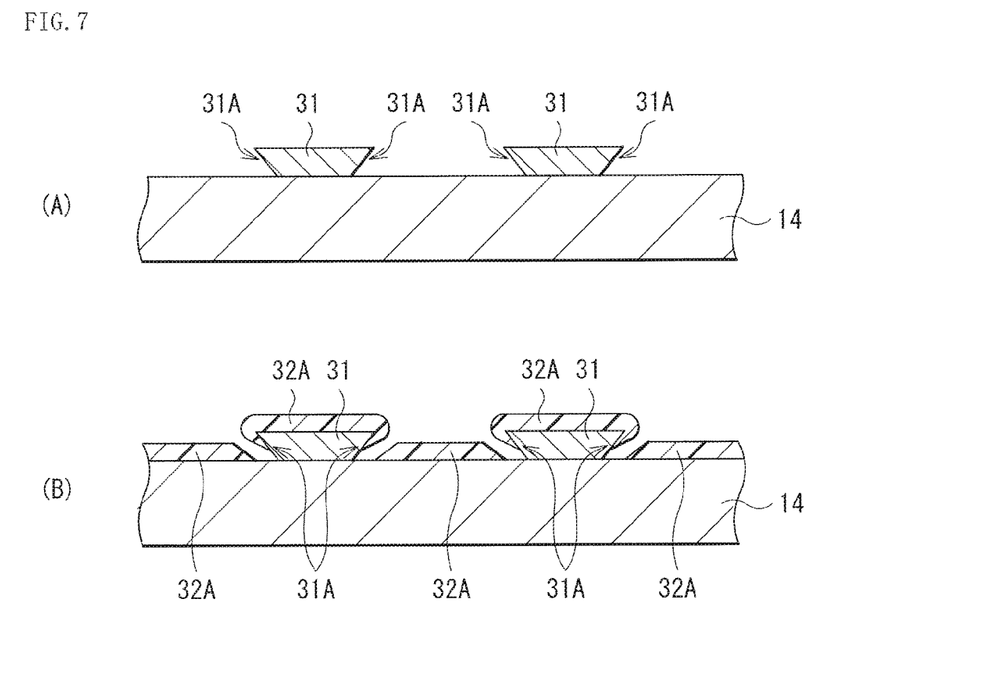
FIG. 7 is a cross-sectional view showing an example of a manufacturing process for the organic EL device illustrated in FIG. 3.

Next, with reference to FIG. 7, the description is provided on a method of manufacturing the organic EL device 13. FIG. 7 shows an example of a manufacturing process for the organic EL device 13.

First, the anode electrodes 31 are formed on the TFT substrate 14 (FIG. 7A). For example, a mask layer having cone-shaped apertures may be formed on the TFT substrate 14, and a predetermined metallic material may be filled into those apertures. Thereafter, the mask layer is removed. This makes it possible to form the anode electrodes 31 the side surfaces of which are in the inverse tapered shape.

It is to be noted that when the side surface of the hole injection layer 32A is formed in the eaves-like shape, the following process may be carried out, for example. First, a first mask layer having apertures is formed on the TFT substrate 14, and a predetermined metallic material is filled into these apertures. Next, a second mask layer is formed that has apertures with diameters larger than those of the above-described apertures. On this occasion, the second mask layer is formed in such a manner that the whole top surface of the filled metallic material is exposed on the bottom surfaces of the apertures. Thereafter, a predetermined metallic material is filled into the apertures on the second mask layer. Afterward, the first mask layer and the second mask layer are removed. This makes it possible to form the anode electrodes 31 the side surfaces of which are in the eaves-like shape.

Subsequently, by the use of a vapor-deposition method, for example, materials for constituting the hole injection layers 32A are laminated over a whole determined region including the anode electrodes 31 (a region corresponding to a region including all the pixels 11 inside the display region 10A). As shown in FIG. 7B, this makes it possible to form the hole injection layers 32A where the high-resistivity structures (stepped-cut structures) are formed corresponding to the side surfaces of the anode electrodes 31. Thereafter, by the use of the vapor-deposition method, for example, the hole transportation layers 32B, the organic layers 32C, and the electron transportation layers 32D are formed sequentially. For example, the hole transportation layer 32B may be formed on the top surface of the hole injection layer 32A, and the organic layer 32C may be formed immediately above the anode electrode 31 on the top surface of the hole transportation layer 32B. Further, the electron transportation layer 32D may be formed over a predetermined region including the organic layer 32C. In such a manner, the organic EL devices 13 are formed on the TFT substrate 14. Subsequently, the cathode electrodes 33 are formed over a whole surface including the organic EL devices 13. Such a manner makes it possible to form the organic EL devices 13 on the TFT substrate 14.

[Advantageous Effects]

Next, the description is provided on the advantageous effects of the display unit 1 according to this embodiment of the present technology.

In a case where an organic EL device is a low-molecular vapor-deposited type, when the organic EL devices are arranged in an array, a light-emitting layer is typically formed by performing the vapor deposition selectively on each pixel basis using an evaporation mask. However, any other layers excluding the light-emitting layer on an organic layer may be preferably formed in common in each pixel in terms of the improvement in productivity and the reduction in manufacturing costs. Nevertheless, if a hole injection layer is formed in common in each pixel, a leakage current occurs between the adjacent pixels due to low resistivity of the hole injection layer. For example, as shown in FIG. 6, a leakage current from a luminescent pixel reaches a pixel (a pixel on the right side in FIG. 6) that is placed adjacent to the luminescent pixel. This results in any pixels other than desired pixels being luminescent as well, leading to occurrence of color mixture and deterioration in the image quality.

On the contrary, in this embodiment of the present technology, the side surface 31A of the anode electrode 31 is structured in such a manner that the cross-sectional area of the anode electrode 31 on the side of the cathode electrode 33 is larger than that of the anode electrode 31 on the opposite side of the cathode electrode 33. More specifically, the side surface 31A of the anode electrode 31 takes the inverse tapered shape or the eaves-like shape. Consequently, for example, when the hole injection layer 32A is laminated over a whole region corresponding to a region including all the pixels 11 inside the display region 10A, a high-resistivity structure is formed at a position corresponding to the side surface 31A of each of the anode electrodes 31 on the hole injection layer 32A. As a result, for example, as shown in FIG. 5, the current density decreases rapidly at a position of the high-resistivity structure on the hole injection layer 32A, and thus it is possible to suppress occurrence of a leakage current between the adjacent pixels 11. Thereupon, this makes it possible to suppress occurrence of color mixture and deterioration in the image quality.

2. Application Examples

Hereinafter, the description is provided on application examples of the display unit 1 that is described in the above-described respective embodiments and the modification examples thereof of the present technology. The above-described display unit 1 is applicable to display units in electronic apparatuses in every field that display externally input image signals or internally generated image signals as images or video pictures, such as a television receiver, a digital camera, a notebook personal computer, a mobile terminal including a mobile phone, or a video camera.

(Module)

Figure 8:
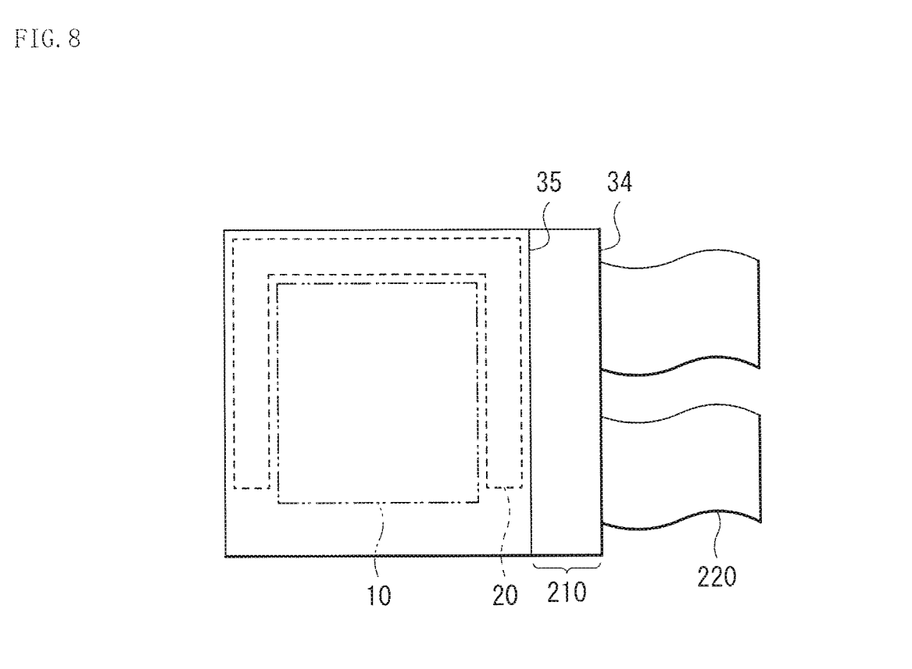
FIG. 8 is a plan view showing a simplified configuration of a module including the display unit according to the above-described embodiment of the present technology.

The above-described display unit 1 may be incorporated into various electronic apparatuses according to application examples 1 to 5 to be hereinafter described as a module as shown in FIG. 8, for example. This module may be configured, for example, in such a manner that a region 210 exposed from a sealing substrate 35 is provided on one side of a substrate 34, and external connection terminals (not shown in the drawing) are formed by extending wiring of the driving circuit 20 at this exposed region 210. An FPC (Flexible Printed Circuit Board) 220 for signal input/output may be provided at these external connection terminals.

Application Example 1

Figure 9:
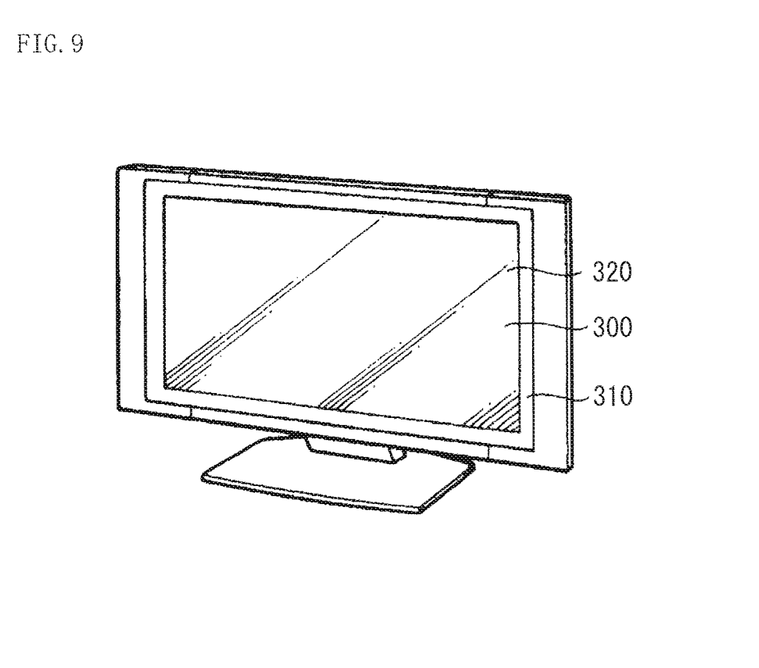
FIG. 9 is a perspective view showing an external appearance of an application example 1 for a light emitting unit according to the above-described embodiment of the present technology.

FIG. 9 shows an external appearance of a television receiver to which the above-described display unit 1 is applicable. This television receiver may have, for example, an image display screen section 300 including a front panel 310 and a filter glass 320, and this image display screen section 300 is configured of the above-described display unit 1.

Application Example 2

Figure 10:
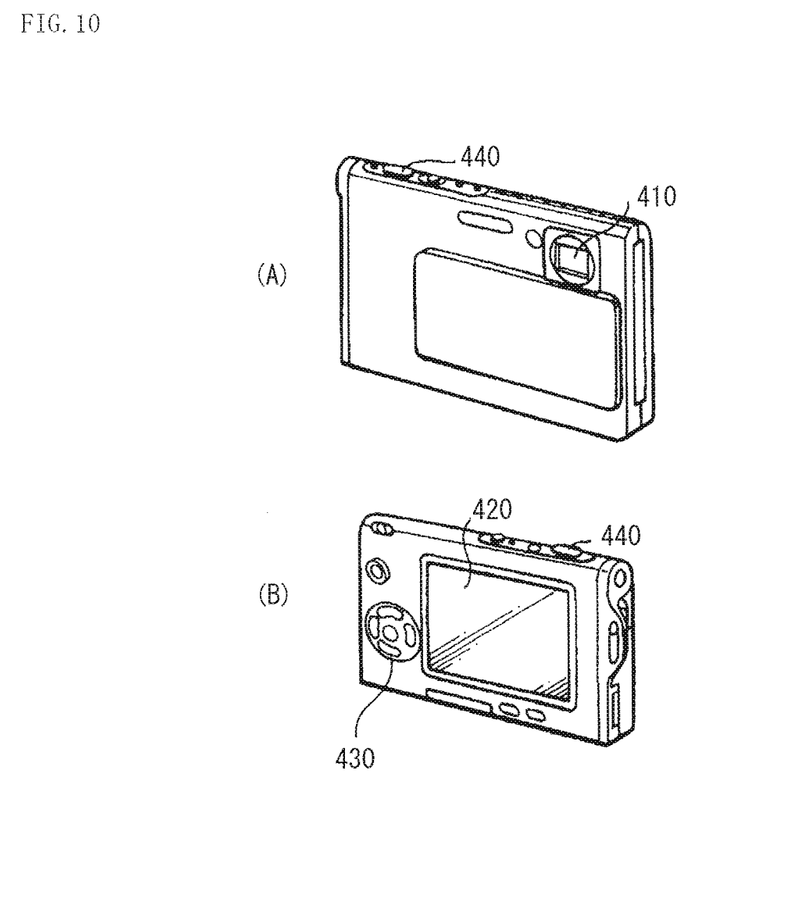
FIG. 10A is a perspective view showing an external appearance viewed from the front side of an application example 2.
FIG. 10B is a perspective view showing an external appearance viewed from the backside of the application example 2.

FIG. 10 shows an external appearance of a digital camera to which the above-described display unit 1 is applicable. This digital camera may have, for example, a light-emitting section 410 for flashing, a display section 420, a menu switch 430, and a shutter button 440, and this display section 420 is configured of the above-described display unit 1.

Application Example 3

Figure 11:
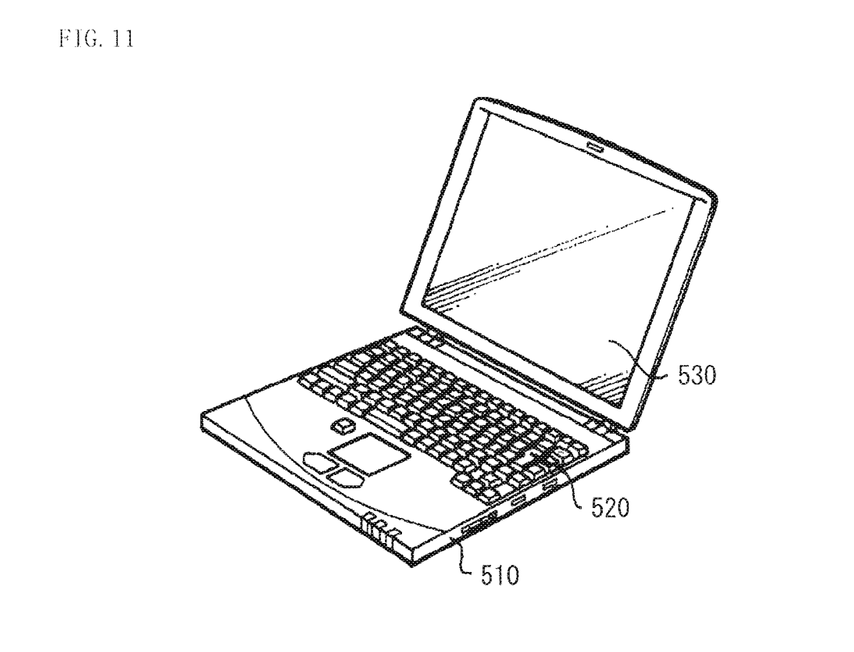
FIG. 11 is a perspective view showing an external appearance of an application example 3.

FIG. 11 shows an external appearance of a notebook personal computer to which the above-described display unit 1 is applicable. This notebook personal computer may have, for example, a main unit 510, a keyboard 520 for operation of entering characters and the like, and a display section 530 for displaying images, and this display section 530 is configured of the above-described display unit 1.

Application Example 4

Figure 12:
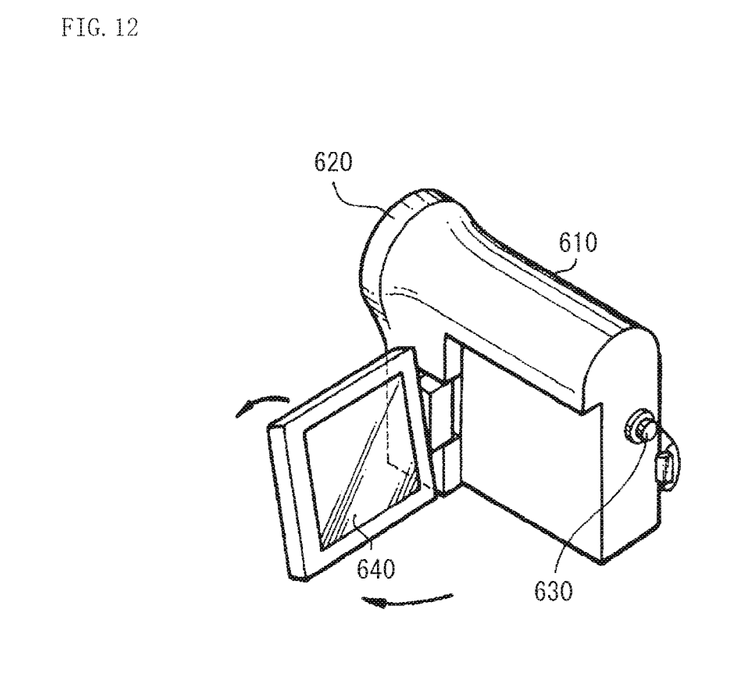
FIG. 12 is a perspective view showing an external appearance of an application example 4.

FIG. 12 shows an external appearance of a video camera to which the above-described display unit 1 is applicable. This video camera may have, for example, a main unit section 610, a lens 620 for photographing a subject that is provided at the front lateral surface of this main unit section 610, a start/stop switch 630 at the photographing time, and a display section 640, and this display section 640 is configured of the above-described display unit 1.

Application Example 5

Figure 13:
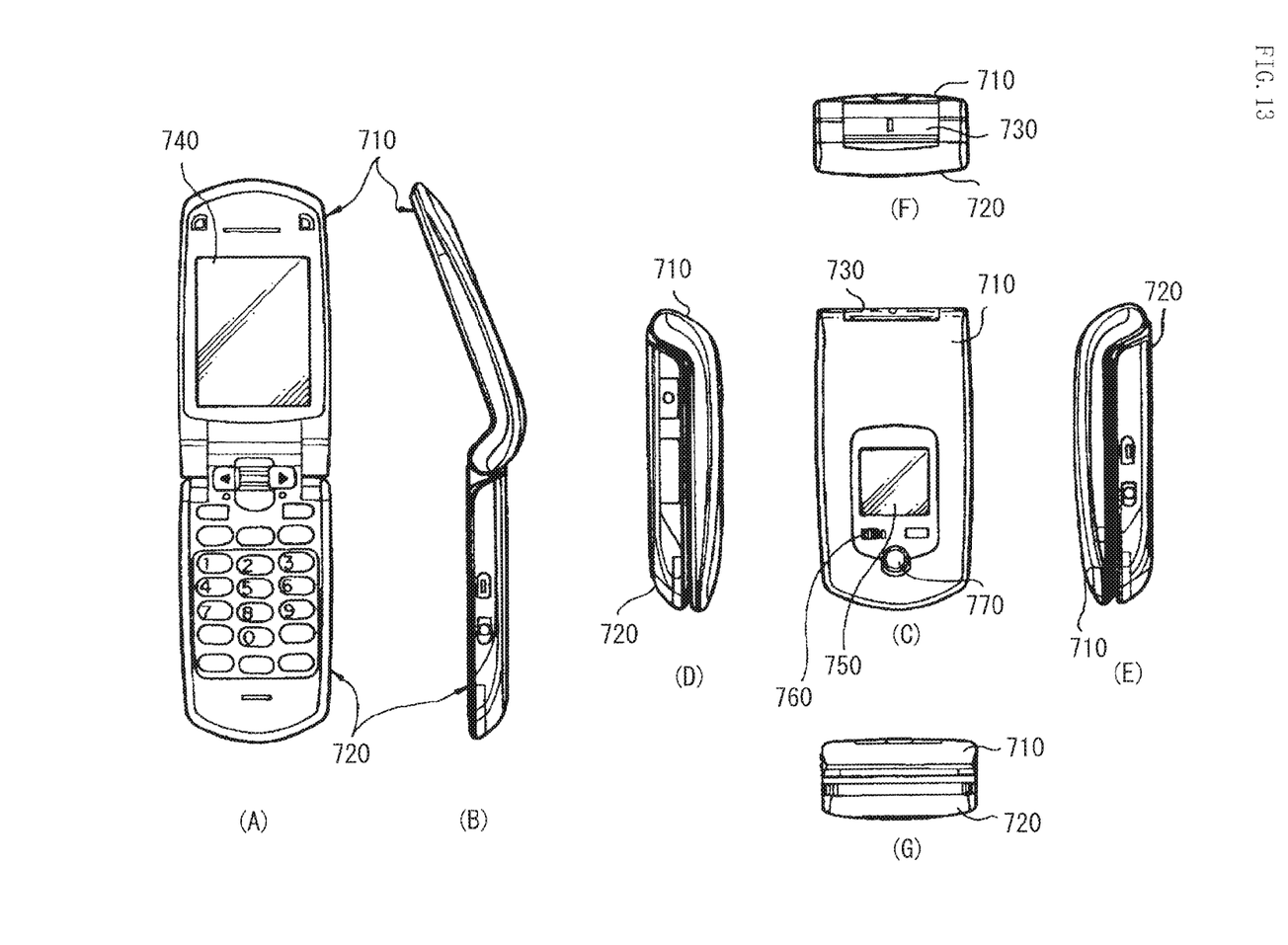
FIG. 13A is a front view of an application example 5 in an open state.
FIG. 13B is a side view thereof.
FIG. 13C is a front view in a closed state.
FIG. 13D is a left side view.
FIG. 13E is a right side view.
FIG. 13F is a top view.
FIG. 13G is a bottom view.

FIG. 13 shows an external appearance of a mobile phone to which the above-described display unit 1 is applicable. For example, this mobile phone may join an upper chassis 710 and a lower chassis 720 by means of a connecting section (hinge section) 730, and may have a display 740, a sub-display 750, a picture light 760, and a camera 770. The display 740 or the sub-display 750 of these component parts is configured of the above-described display unit 1.

The present technology is described thus far with reference to some embodiments and modification examples as well as the application examples, although the present technology is not limited to the above-described embodiments and the like, but different variations are available.

For example, in the above-described embodiment and the like, the description is provided on a case where the above-described display unit 1 is an active-matrix type, although a configuration of the pixel circuit 12 for active-matrix driving is not limited to the configuration described in the above-described embodiment and the like, and a capacitor device, a transistor, and the like may be added to the pixel circuit 12 as necessary. In this case, in addition to the signal line driving circuit 23, the write line driving circuit 24, and the power line driving circuit 25 that are described previously, any necessary driving circuit may be added in response to a modification of the pixel circuit 12.

Further, for example, in the above-described embodiment and the like, the timing generating circuit 21 controls the driving operation in the image signal processing circuit 22, the signal line driving circuit 23, the write line driving circuit 24, and the power line driving circuit 25, although another circuit may control such a driving operation. Alternatively, such a control of the image signal processing circuit 22, the signal line driving circuit 23, the write line driving circuit 24, and the power line driving circuit 25 may be carried out in hardware (circuits) or in software (programs).

Moreover, it is to be noted that the present technique may have configurations such as the followings.

(1)

A display panel, including:

a plurality of pixels at a display region, wherein each of the pixels has an organic EL device, and a pixel circuit that drives the organic EL device, and the organic EL device has an anode electrode, a cathode electrode, and an organic layer that is provided between the anode electrode and the cathode electrode, and a side surface of the anode electrode is structured in such a manner that the cross-sectional area of the anode electrode on the side of the cathode electrode is larger than the cross-sectional area of the anode electrode on the opposite side of the cathode electrode.

(2)

The display panel according to (1), wherein the organic layer has a hole injection layer that improves the hole injection efficiency, a hole transportation layer that improves the hole transportation efficiency, a light-emitting layer that emits light by recombination of electrons and holes, and an electron transportation layer that improves the electron transportation efficiency, and at least the hole injection layer on the organic layer is formed over a whole region including all the pixels inside the display region, and has a high-resistivity structure at a position corresponding to the side surface of each anode electrode.

(3)

The display panel according to (2), wherein the high-resistivity structure is a stepped-cut structure or a local thin-film structure.

(4)

The display panel according to any one of (1) to (3), wherein a side surface of the anode electrode takes the inverse tapered shape.

(5)

The display panel according to any one of (1) to (3), wherein a side surface of the anode electrode takes the eaves-like shape.

(6)

The display panel according to any one of (1) to (5) wherein the organic layer is formed by means of vapor deposition.

(7)

A display unit, including:

a display panel that includes a plurality of pixels at a display region; and a driving circuit that drives each of the pixels, wherein each of the pixels has an organic EL device, and a pixel circuit that drives the organic EL device, and the organic EL device has an anode electrode, a cathode electrode, and an organic layer that is provided between the anode electrode and the cathode electrode, and a side surface of the anode electrode is structured in such a manner that the cross-sectional area of the anode electrode on the side of the cathode electrode is larger than the cross-sectional area of the anode electrode on the opposite side of the cathode electrode.

(8)

An electronic apparatus provided with a display unit, the display unit including:

a display panel that includes a plurality of pixels at a display region; and a driving circuit that drives each of the pixels, wherein each of the pixels has an organic EL device, and a pixel circuit that drives the organic EL device, and the organic EL device has an anode electrode, a cathode electrode, and an organic layer that is provided between the anode electrode and the cathode electrode, and a side surface of the anode electrode is structured in such a manner that the cross-sectional area of the anode electrode on the side of the cathode electrode is larger than the cross-sectional area of the anode electrode on the opposite side of the cathode electrode.

This application claims the priority on the basis of Japanese Patent Application No. 2011-229995 filed on Oct. 19, 2011 in Japan Patent Office, the entire contents of which are incorporated in this application by reference.

The invention claimed is:

1. A display panel, comprising:
   a plurality of pixels at a display region, wherein each of the pixels has an organic EL device, and a pixel circuit that drives the organic EL device, and
   the organic EL device has an anode electrode, a cathode electrode, and an organic layer that is provided between the anode electrode and the cathode electrode,
   wherein the organic layer comprises a hole injection layer which is formed on the anode electrode and a hole transportation layer which is formed on the hole injection layer,
   wherein a side surface of the anode electrode is structured in such a manner that the cross-sectional area of the anode electrode on the side of the cathode electrode is larger than the cross-sectional area of the anode electrode on the opposite side of the cathode electrode,
   wherein a portion of the side surface of the anode electrode is in contact with the hole transportation layer formed on the hole injection layer, and
   wherein a portion of the hole injection layer formed on the side surface of the anode electrode, takes an eaves-like shape such that the portion of the hole injection layer formed on the side surface overhangs the anode electrode.

2. The display panel according to claim 1, wherein the organic layer further includes a light-emitting layer that emits light by recombination of electrons and holes, and an electron transportation layer that improves the electron transportation efficiency, and at least the hole injection layer of the organic layer is formed over a whole region including all the pixels inside the display region, and has a high-resistivity structure at a position corresponding to the side surface of each anode electrode.

3. The display panel according to claim 2, wherein the high-resistivity structure is a stepped-cut structure or a local thin-film structure.

4. The display panel according to claim 1, wherein the side surface of the anode electrode takes the inverse tapered shape.

5. The display panel according to claim 1, wherein the organic layer is formed by means of vapor deposition.

6. A display unit, comprising:
   a display panel that includes a plurality of pixels at a display region; and
   a driving circuit that drives each of the pixels, wherein each of the pixels has an organic EL device, and a pixel circuit that drives the organic EL device, and
   the organic EL device has an anode electrode, a cathode electrode, and an organic layer that is provided between the anode electrode and the cathode electrode,
   wherein the organic layer comprises a hole injection layer which is formed on the anode electrode and a hole transportation layer which is formed on the hole injection layer,
   wherein a side surface of the anode electrode is structured in such a manner that the cross-sectional area of the anode electrode on the side of the cathode electrode is larger than the cross-sectional area of the anode electrode on the opposite side of the cathode electrode,
   wherein a portion of the side surface of the anode electrode is in contact with the hole transportation layer formed on the hole injection layer, and
   wherein a portion of the hole injection layer formed on the side surface of the anode electrode, takes an eaves-like shape such that the portion of the hole injection layer formed on the side surface overhangs the anode electrode.

7. An electronic apparatus provided with a display unit, the display unit comprising:
   a display panel that includes a plurality of pixels at a display region; and
   a driving circuit that drives each of the pixels, wherein each of the pixels has an organic EL device, and a pixel circuit that drives the organic EL device, and the organic EL device has an anode electrode, a cathode electrode, and an organic layer that is provided between the anode electrode and the cathode electrode,
   wherein the organic layer comprises a hole injection layer which is formed on the anode electrode and a hole transportation layer which is formed on the hole injection layer,
   wherein a side surface of the anode electrode is structured in such a manner that the cross-sectional area of the anode electrode on the side of the cathode electrode is larger than the cross-sectional area of the anode electrode on the opposite side of the cathode electrode,
   wherein a portion of the side surface of the anode electrode is in contact with the hole transportation layer formed on the hole injection layer, and
   wherein a portion of the hole injection layer formed on the side surface of the anode electrode, takes an eaves-like shape such that the portion of the hole injection layer formed on the side surface overhangs the anode electrode.

8. The display panel according to claim 1, wherein a resistivity of the portion of the hole injection layer formed on the side surface of the anode electrode is greater than a resistivity of a portion of the hole injection layer other than the portion formed on the side surface of the anode electrode and wherein the portion of the hole injection layer formed on the side surface of the anode electrode that overhangs the anode takes an inverse tapered shape on the side surface of the anode electrode.

9. The display panel according to claim 1, wherein a light emitting layer of the organic layer is formed selectively for each of the pixels.

10. A display panel, comprising:
   a plurality of pixels at a display region, wherein each of the pixels has an organic EL device, and a pixel circuit that drives the organic EL device, and
   the organic EL device has an anode electrode, a cathode electrode, and an organic layer that is provided between the anode electrode and the cathode electrode,
   wherein the organic layer comprises a hole injection layer which is formed on the anode electrode and a hole transportation layer which is formed on the hole injection layer,
   wherein a side surface of the anode electrode is structured in such a manner that the cross-sectional area of the anode electrode on the side of the cathode electrode is larger than the cross-sectional area of the anode electrode on the opposite side of the cathode electrode, wherein a portion of the side surface of the anode electrode is in contact with the hole transportation layer formed on the hole injection layer, wherein a resistivity of a portion of the hole injection layer formed on the side surface of the anode electrode is greater than a resistivity of a portion of the hole injection layer other than the portion formed on the side surface of the anode electrode, and wherein the portion of the hole injection layer with high resistivity is formed in an inverse tapered shape on the side surface of the anode electrode.

* * * * *